United States Patent
Shah et al.

(10) Patent No.: US 8,796,082 B1
(45) Date of Patent: Aug. 5, 2014

(54) METHOD OF OPTIMIZING A GA—NITRIDE DEVICE MATERIAL STRUCTURE FOR A FREQUENCY MULTIPLICATION DEVICE

(71) Applicant: U.S. Army Research Laboratory ATTN: RDRL-LOC-I, Adelphi, MD (US)

(72) Inventors: Pankaj B. Shah, Adelphi, MD (US); H. Alfred Hung, Bethesda, MD (US)

(73) Assignee: The United States of America as represented by the Scretary of the Army, Washington, DC (US)

( * ) Notice: Subject to any disclaimer, the term of this patent is extended or adjusted under 35 U.S.C. 154(b) by 0 days.

(21) Appl. No.: 13/774,387

(22) Filed: Feb. 22, 2013

(51) Int. Cl.
*H01L 21/338* (2006.01)
(52) U.S. Cl.
USPC ............... 438/172; 438/48; 438/483; 257/76; 257/194
(58) Field of Classification Search
USPC ............... 438/48, 172, 483; 257/76, 194, 615
See application file for complete search history.

(56) References Cited

U.S. PATENT DOCUMENTS

2003/0180980 A1* 9/2003 Margalith et al. ............... 438/48
2009/0278233 A1* 11/2009 Pinnington et al. ............ 257/615
2010/0264461 A1* 10/2010 Rajan et al. .................... 257/194

OTHER PUBLICATIONS

M. Krach, et al."Frequency Tripler with Anti-Serial Schottky Diodes," ADA 398789, International Conference on Terahertz Electronics [8th], Held in Darmstadt, Germany on Sep. 28-29, 2000.

Douglas, e., et al., "Investigation of the effect of temperature during off-state degradation of AlGaN/GaN High Electron Mobility Transistors," Microelectronics Reliability 52 pp. 23-28 (2012) http://dx.doi.org/10.1016/j.microrel.2011.09.018.
M. Krach, J. Freyer, and M. Claassen, "Power generation at millimetre-wave frequencies using GaAs/GaAlAs triplers," Phys. Stat. Sol. (c) vol. 1, p. 2160-2182 (2004).
Jin. C. "A Novel Ga—N Based High Frequency Varactor Diode," Proceedings of the 5h European Microwave Integrated Circuits Conference, pp. 118-121 (2010).
W. Lu, et al., "InGaN/GaN Schottky diodes with enhanced voltage handling capability for varactor applications," IEEE Electron Device Lett., 31 (2010), pp. 1119-1121.
M. Marso, et al., "Comparison of AlGaN/GaN MSM varactor diodes based on HFET and MOSHFET layer structures" IEEE Electron Device Lett., 27 (2006), pp. 945-947.
M. Saglam, et al., "Influence of polarization charges in Al0.4Ga0.6N/GaN barrier varactors," Appl. Phys. Lett., 82 (2003), pp. 227-229.

(Continued)

*Primary Examiner* — Phuc Dang
(74) *Attorney, Agent, or Firm* — Lawrence E. Anderson

(57) ABSTRACT

A preferred method of optimizing a Ga-nitride device material structure for a frequency multiplication device comprises:
determining the amplitude and frequency of the input signal being multiplied in frequency;
providing a Ga-nitride region on a substrate;
determining the Al percentage composition and impurity doping in an AlGaN region positioned on the Ga-nitride region based upon the power level and waveform of the input signal and the desired frequency range in order to optimize power input/output efficiency; and
selecting an orientation of N-face polar GaN or Ga-face polar GaN material relative to the AlGaN/GaN interface so as to orient the face of the GaN so as to optimize charge at the AlGaN/GaN interface. A preferred embodiment comprises an anti-serial Schottky varactor comprising: two Schottky diodes in anti-serial connection; each comprising at least one GaN layer designed based upon doping and thickness to improve the conversion efficiency.

9 Claims, 12 Drawing Sheets

Epi-layer Composition of Regions S1, S2, S3 of the structure shown in FIG. 1

(56) References Cited

OTHER PUBLICATIONS

N. Tanuma, et al., "Capacitance analysis of Al0.25Ga0.75N/GaN heterostructure barrier varactor diodes," Phys. Status Solidi (c), 2 (2005), pp. 2692-2695.

O. Ambacher, et al., "Two dimensional electron gases induced by spontaneous and piezoelectric polarization in undoped and doped AlGaN/GaN heterostructures," J. Appl. Phys., 87 (2000), pp. 334-344.

M. Krach, et al., "An integrated ASV frequency tripler for millimeter-wave applications," Proceedings of the 33rd European Microwave Conference, vol. 3, 2003, pp. 1279-1281.

R. Oberhuber, et al., Mobility of two-dimensional electrons in AlGaN/GaN modulation-doped field-effect transistors, Appl Phys. Lett., 73 (1998), pp. 818-820.

A. Jarndal & G. Kompa, "A new small signal modeling approach applied to GaN devices," IEEE Trans. Microwave Theory Tech. 53 (2005) 3440-3448.

V. Fiorentini, et al., "Evidence for nonlinear macroscopic polarization in III-V nitride alloy heterostructures," Appl. Phys. Lett. 80 (2002) 1204-1206.

D. Qiao, et al. "Dependence of Ni/AlGaN Schottky barrier height on Al mole fraction," J. Appl. Phys. 87 (2000) 801-804.

M. Farahmand, et al., "Monte Carlo simulation of electron transport in the III-Nitride Wurtzite phase materials system: binaries and ternaries," IEEE Trans. Electron Devices 48 (2001)535-542.

U. V. Bhapkar & M.S.Shur, "Monte Carlo calculation of velocity-field characteristics of Wurtzite GaN," J.Appl. Phys. 82 (1997)1649-1655.

A. Reklaitis, "Efficient heterostructure doped-barrier varactor diodes," J.Appl. Phys. 105 (2009) 024502-1-024502-5.

Y. Morandini, et al., "Characterization of MOS varactor with Large Signal Network Analyser (LSNA) in CMOS 65 nm bulk and SOI technologies," Proceedings of the 69th ARFTG Conference, vol. 1, 2007, pp. 1-4.

W. L. Liu, et al. "Capacitance—voltage spectroscopy of trapping states in GaN/AlGaN heterostructure field-effect transistors," J. Nanoelectron. Optoelectron. 1 (2006) 258-263.

D. Choudhury, et al., "Study of the effect of the Cmax/Cmin Ratio on the Performance of Back-to-Back Barrier-N—N (bbBNN) varactor frequency multipliers," IEEE Microwave Guided Wave Lett. 4 (1994) 101-103.

Rajan, et al., "N-polar GaN/AlGaN/GaN high electron mobility transistors," J. Appl. Phys. 102 (2007) 044501-1-044501-6.

\* cited by examiner

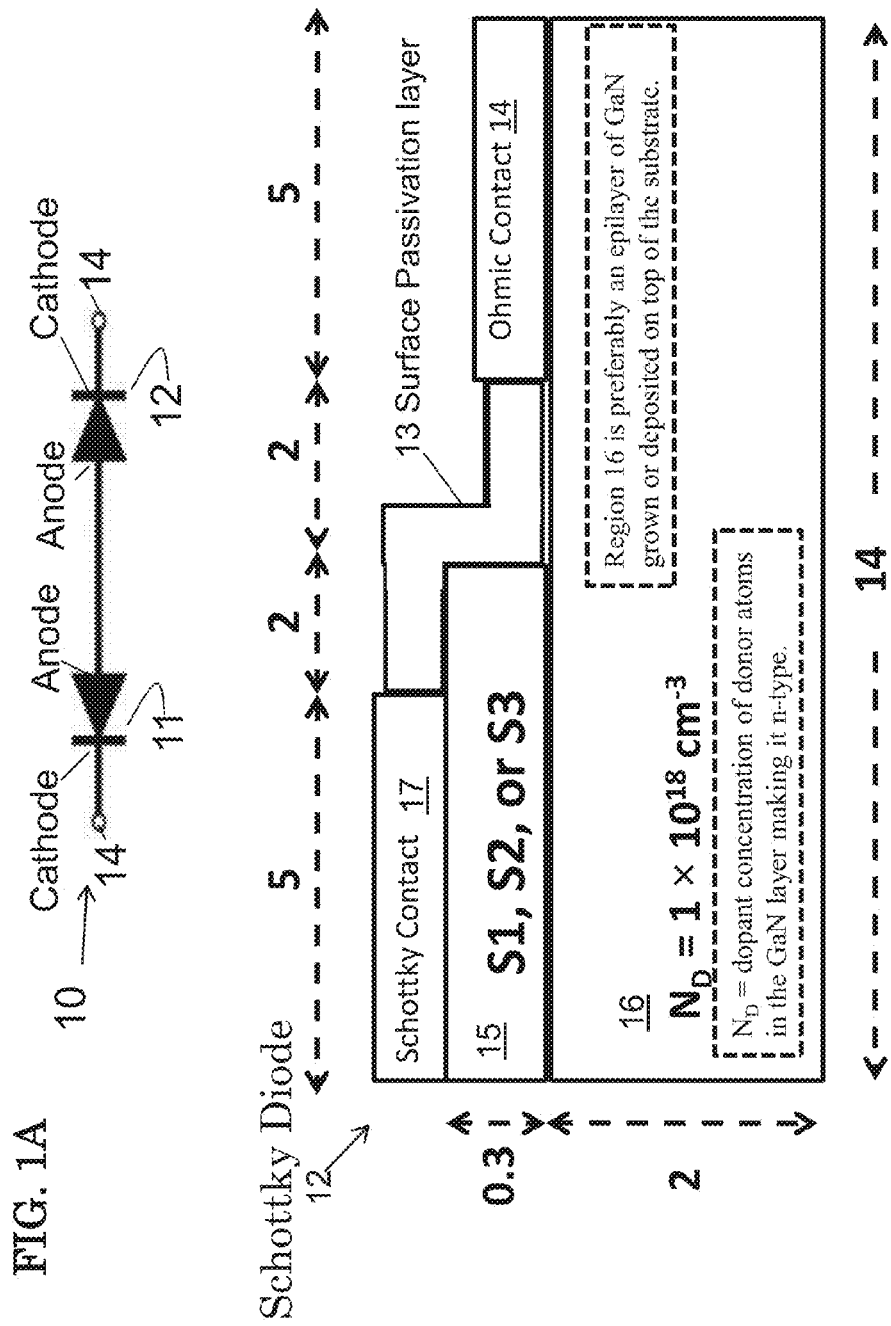
FIG. 1B the cross sectional structure of one half (one Schottky Diode 12) of the ASV 10. All dimensions are approximate and are in micrometers.

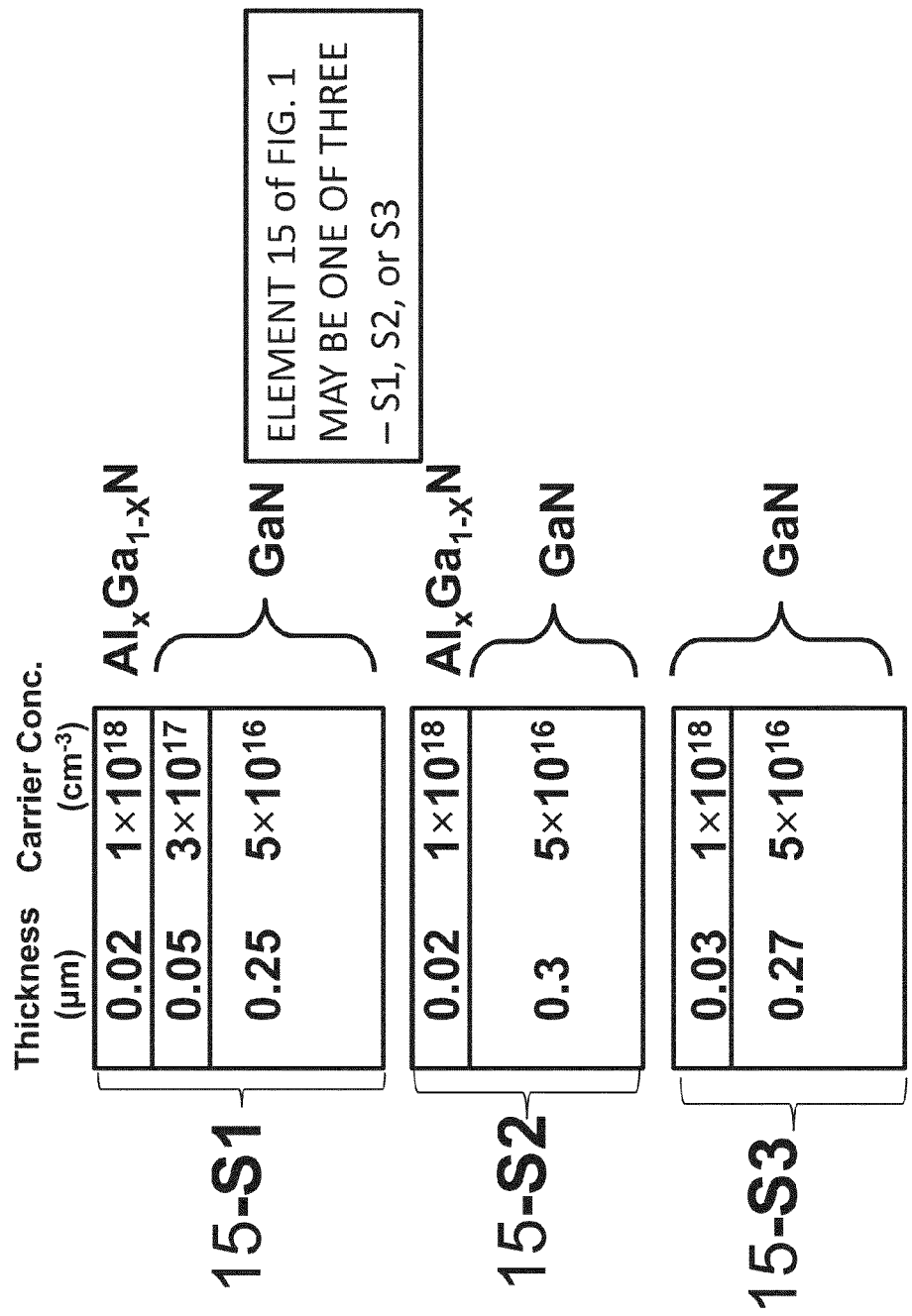
FIG. 2 Epi-layer Composition of Regions S1, S2, S3 of the structure shown in FIG. 1

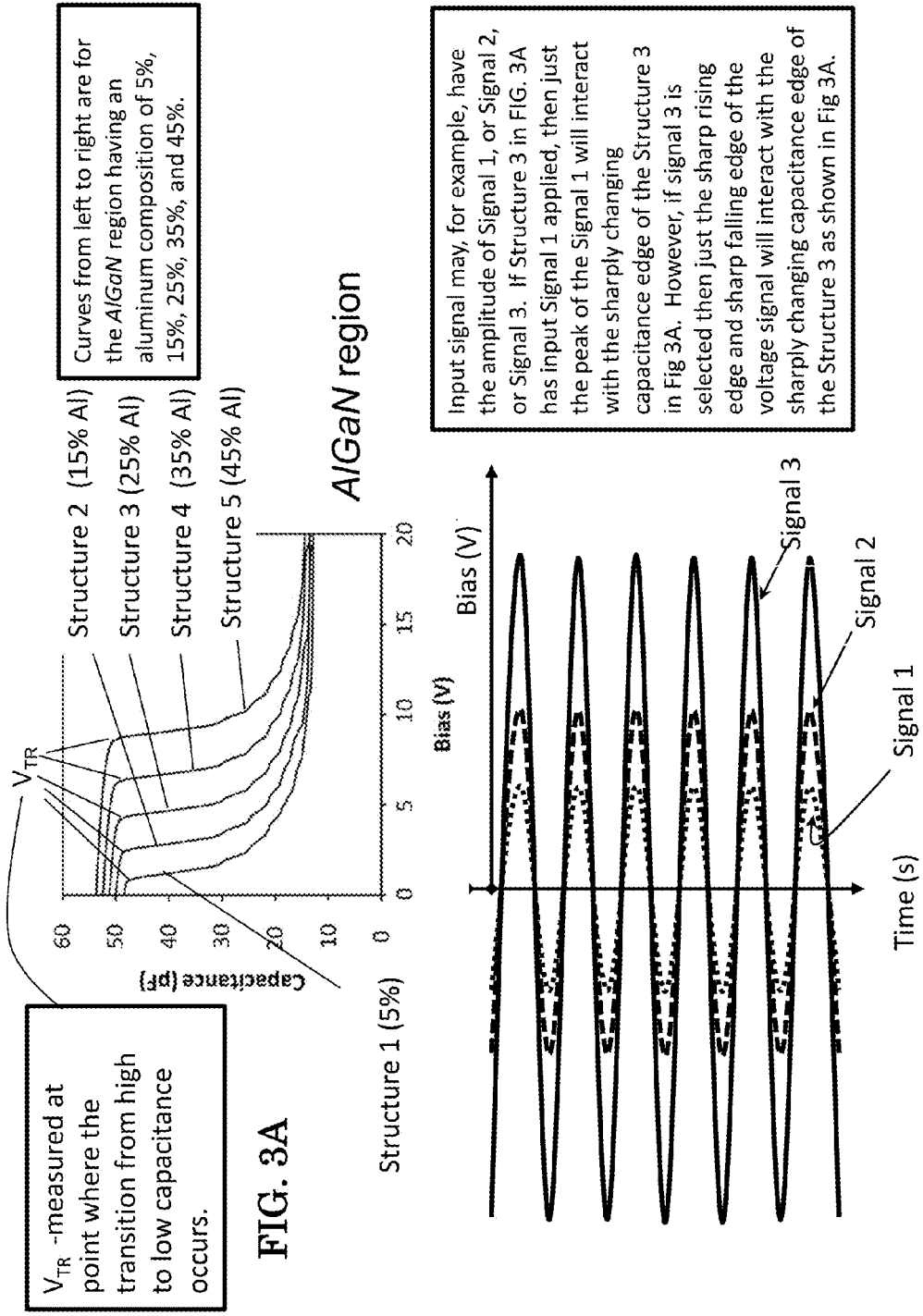
FIG. 3B Choice of structure based on input power. The semi-insulating region is designed so that the overlap of the signal with the capacitance-voltage curve is ideal for maximum conversion efficiency.

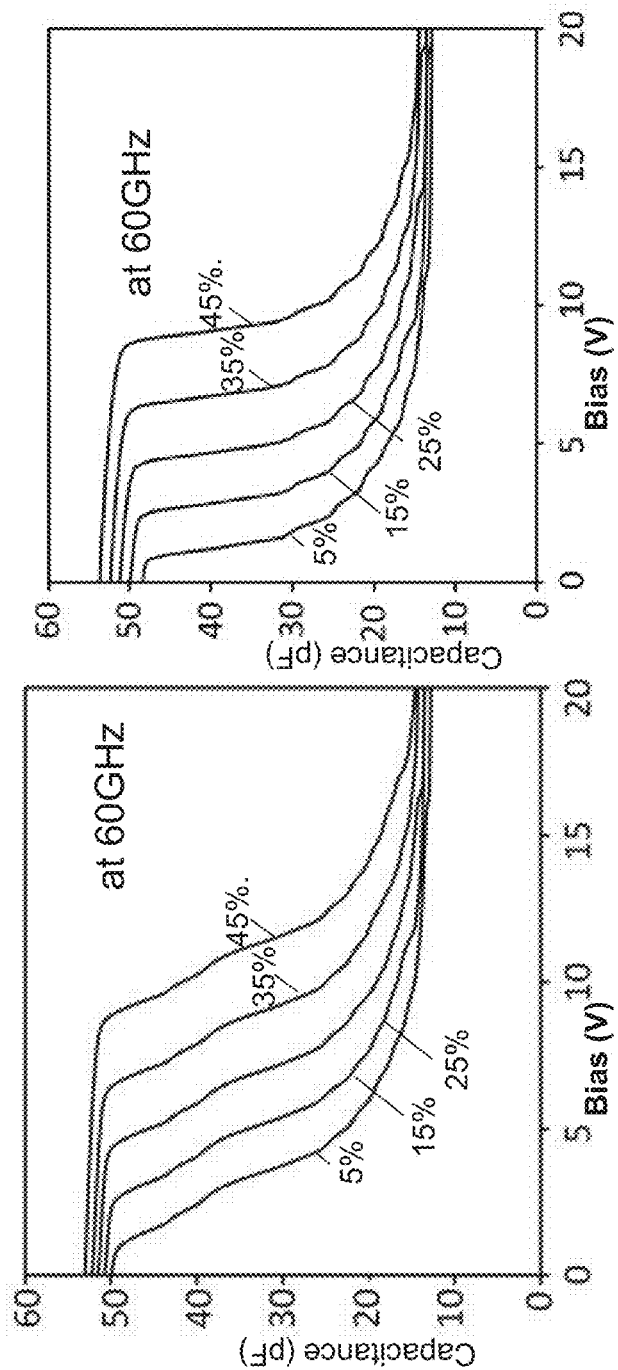
FIG. 3C – S1 (15)
FIG. 3D – S2 (15)
Curves with capacitance transitions going from left to right in bias correspond to devices with AlGaN region aluminum percentages of 5%, 15%, 25%, 35%, and 45%.

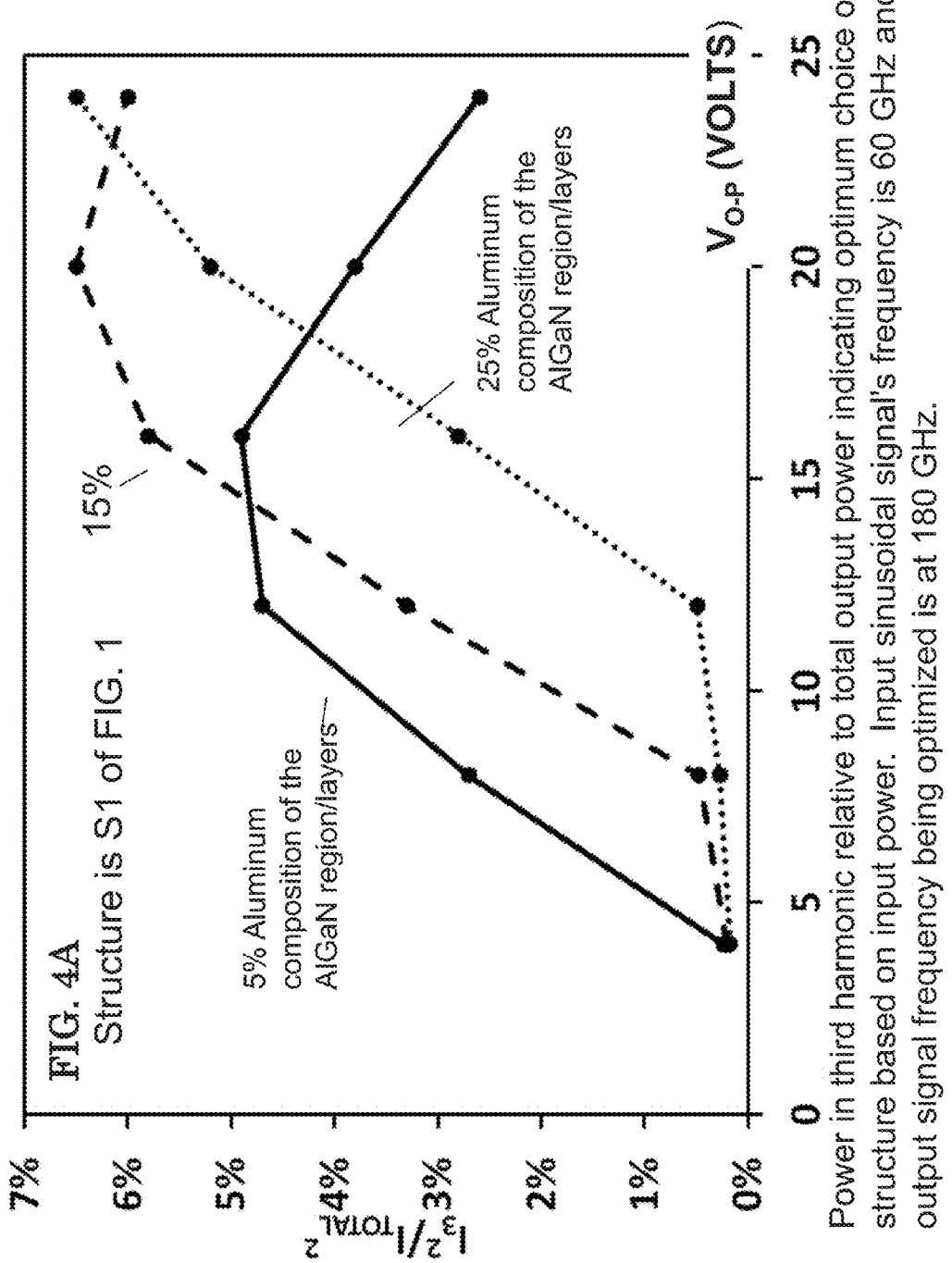

BOTH FIGS. 5A & 5B Show power in the third harmonic relative to total power across the ASV for an input sinusoidal signal with zero to peak amplitude between 4 and 24 V

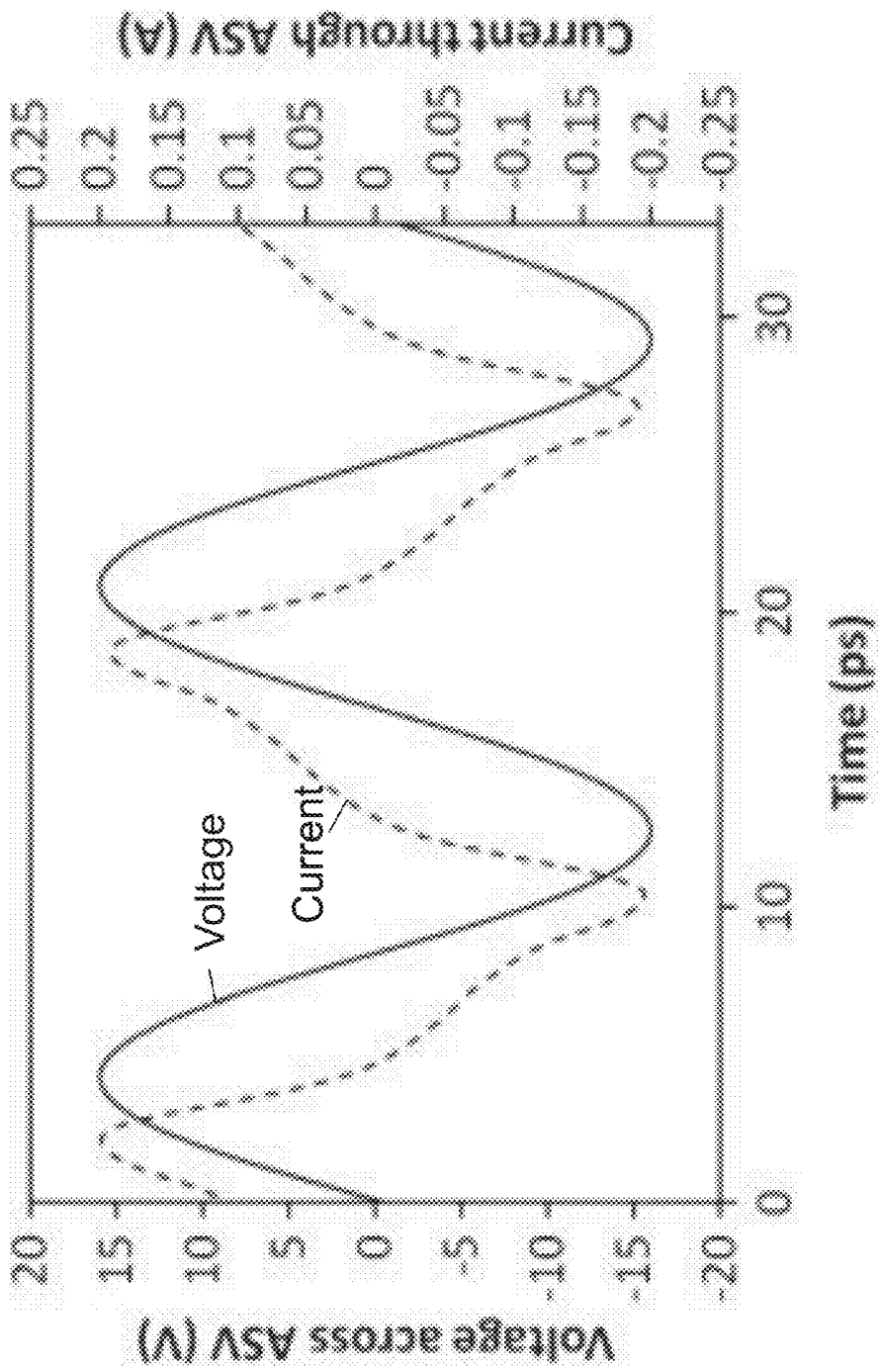
FIG. 6. Current and voltage across the ASV comprising structure S2 with AlGaN layer aluminum composition of 15%, for the 60 GHz input sinusoid with $V_{0-p}$ of 16 V.

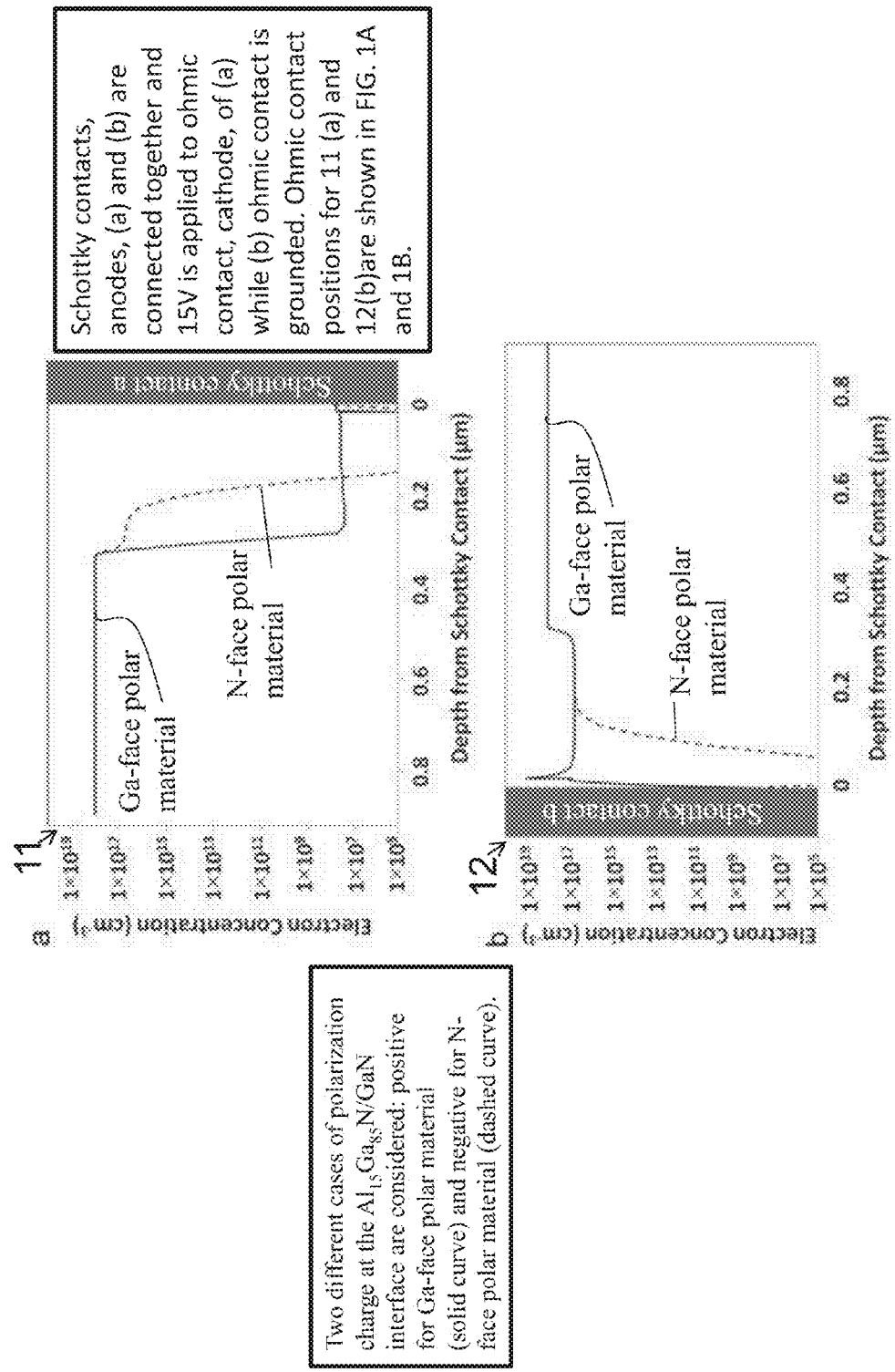
FIG. 8. Electron concentration for an ASV containing the layer structure S2 and with 15% Al composition at 15 V applied bias.

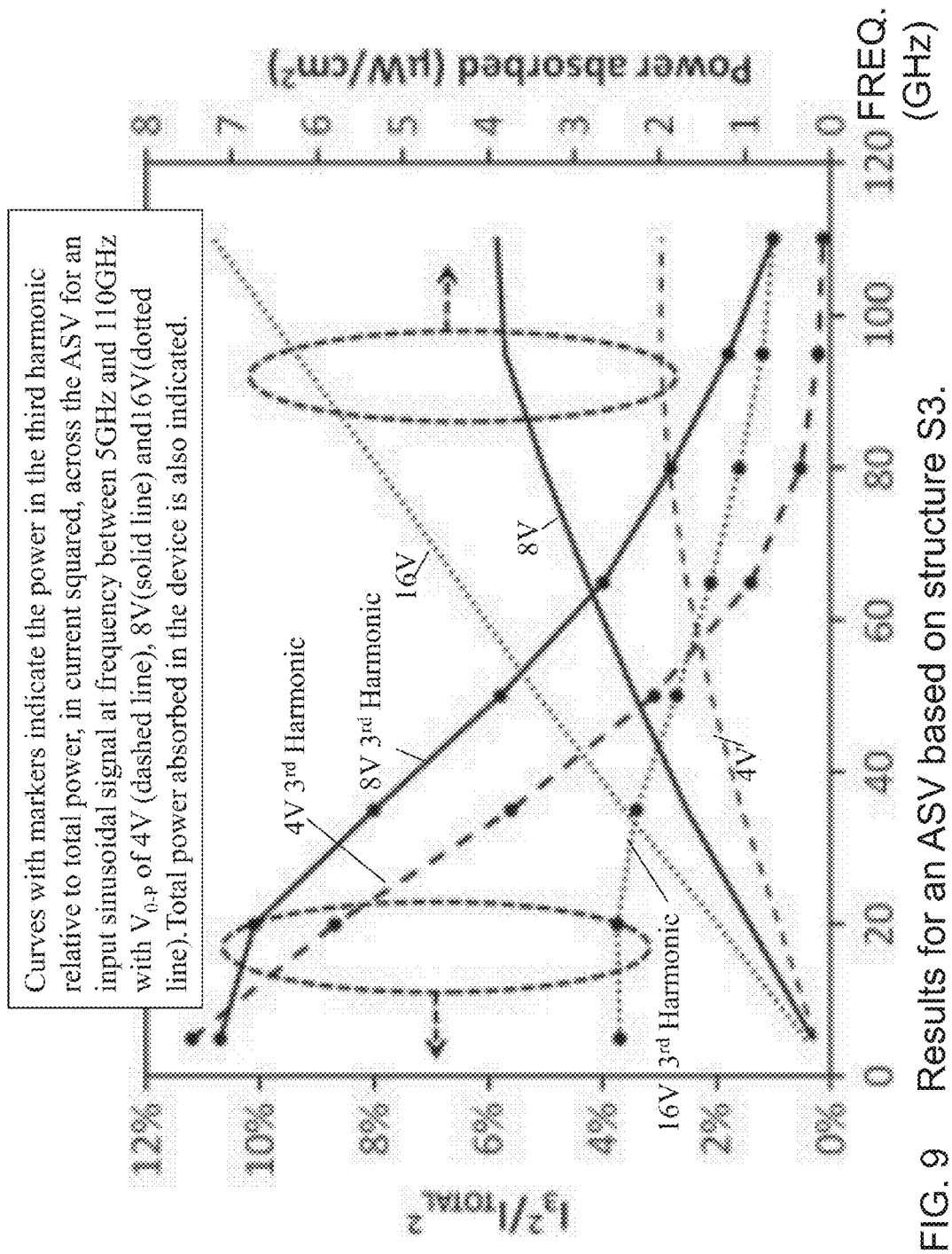
FIG. 9  Results for an ASV based on structure S3.

METHOD OF OPTIMIZING A GA—NITRIDE DEVICE MATERIAL STRUCTURE FOR A FREQUENCY MULTIPLICATION DEVICE

GOVERNMENT INTEREST

The embodiments herein may be manufactured, used, and/or licensed by or for the United States Government without the payment of royalties thereon.

BACKGROUND OF THE INVENTION

A frequency multiplier (e.g. a tripler) is a device that, as an example, takes an input signal at 30 GHz and converts some of the energy from this input signal into an output signal at 90 GHz. Because a frequency multiplier is used to generate an output at a different frequency from the input, one of the goals of an optimized structure is efficient operation whereby the energy transferred to the new frequency at the output is maximized. The same methodology for the device/structure and optimization can also be applied to obtain higher harmonics, such as the fifth order of conversion, which will be useful for sub-millimeter wave signal generation.

Varactor multipliers have first been conceptualized back in the mid 1960s. However, little has been done insofar as a conceptual method on how to optimize the device-material structure for highest frequency conversion efficiency at a particular output power level.

According to Wikipedia, varactors are operated in a reverse-biased state. No current flows, but since the thickness of the depletion zone varies with the applied bias voltage, the capacitance of the diode can be made to vary. Generally, the depletion region thickness is proportional to the square root of the applied voltage; capacitance is inversely proportional to the depletion region thickness. Thus, the capacitance is inversely proportional to the square root of applied voltage. The depletion layer can also be made of a MOS or a Schottky diode.

SUMMARY

A preferred embodiment of the present invention comprises a semi-insulator GaN (or SiC, or AN) substrate antiserial Schottky varactor for efficient power-selective microwave to sub-millimeter wave frequency signal multiplier involving varying the aluminum composition of an AlGaN barrier layer to maximize, inter alia, output power efficiency. In place of the AlGaN barrier, any semi-insulating layer with energy gap greater than 3.5 and free carrier mobility less than 300 cm2/V/s may be used. This list would include properly grown and doped diamond or boron-nitride appropriately grown for good crystalline quality on GaN. In a preferred methodology, selection of AlGaN/GaN varactors containing either (1) a high-doped/low-doped GaN region or (2) just a low doped GaN region is utilized depending upon the amplitude of the input signal being tripled in frequency. Stronger susceptance modulation is exhibited in AlGaN/GaN Antiseries Schottky Varactors (ASVs) made from Ga-face polar material compared to N-face polar material. Results indicate that as a frequency tripler choosing the proper aluminum composition results in 27% conversion efficiency with an input signal of 5 GHz and over 7% conversion efficiency with an input signal of 60 GHz along with optimization trends. With input voltage amplitudes over 10 V, an AlGaN/GaN structure with 15% Al provides greater conversion efficiency than one with 5% Al. Power absorbed in the varactor also increases as aluminum percent increases, affecting reliability and power transfer. Results of a GaN-based ASV performing as a frequency tripler for fundamental frequencies up to 110 GHz indicate an advantage to using an AlGaN/GaN epi-structure over only a GaN epi-structure.

A preferred method of optimizing a Ga-nitride device material structure for a frequency multiplication device comprises:

determining the amplitude and frequency of the input signal being multiplied in frequency;

providing a Ga-nitride region on a substrate (GaN, or SiC, or AN);

determining the percentage composition of Al in an AlGaN region to be positioned on the Ga-nitride region by selecting an aluminum composition percentage for doping based upon the desired frequency range for the frequency multiplication device in order to optimize power input/output efficiency; and selecting an orientation of N-face polar GaN or Ga-face polar GaN material relative to the AlGaN/GaN interface so as to orient the face of the GaN and to optimize charge at the AlGaN/GaN interface.

Optionally, the method may incorporate the selection of Ga-face polar material as the N-face polar material creates a negative charge at the AlGaN/GaN barrier that repels electrons, and negatively impacts the susceptance modulation as indicated by electron concentrations.

Optionally, the method may further comprise modeling the Ga-nitride material using drift-diffusion modeling based upon numerical simulations to produce the capacitance-voltage curves when a predetermined sinusoidal input voltage signal at a predetermined frequency in the range of 6 to 60 GHz is applied to the structure, and adjusting the impurity doping of the AlGaN and GaN regions to optimize the nonlinear shape of the capacitance-voltage curve that is responsible for frequency multiplication so that the $V_{TR}$ (transition voltage) voltage, measured at the point where the transition from high to low capacitance occurs in the capacitance-voltage curve is optimal for an input RF signal of a certain power level, indicating peak voltage of input signal, whereby the structure is optimized for the input power to be upconverted to a higher frequency.

Optionally, the power input/output efficiency may be optimized dependent upon input voltage, and, for input voltages over 10 volts, an AlGaN/GaN structure with approximately 15% Aluminum may be utilized to provide greater conversion efficiency than an AlGaN/GaN structure with approximately 5% Aluminum.

Optionally one can make a tradeoff by determining if the efficiency gain from increasing the aluminum percent is a better outcome vs. as it may also lead to reduced lifetime due to heating of the device, but if the cost savings from increased efficiency is worth the reduced lifetime, this is a good result.

Optionally, the frequency multiplier is a varactor having an input signal, and the method further includes modeling based upon numerical simulations to produce the capacitance-voltage curves, and wherein the aluminum composition of the AlGaN region and impurity doping of the AlGaN and GaN regions can be adjusted so that the voltage, $V_{TR}$ measured where the transition from high to low capacitance occurs in the capacitance-voltage curves, which is a point of nonlinearity in the curves, is optimal for an input RF signal of a predetermined input power level measured at peak voltage of an input signal.

Optionally, the method may comprise controlling the voltage, $V_{TR}$, where the transition from high capacitance to low capacitance is optimized by utilizing the intrinsic carrier concentration of the wide-bandgap material, AlGaN, which has a much higher intrinsic free carrier concentration as compared to AlGaAs.

Optionally, the top of the AlGaN region is Ga-polar material which leads to optimal spontaneous and piezoelectric polarization that produces optimal electric fields for optimal performance.

Another preferred method for providing a varactor frequency multiplier structure comprises:

providing a substrate and at least one semi-insulating region comprising one or more of GaN, AlGaN, and impurity doped AlGaN;

modeling based upon numerical simulations to produce the capacitance-voltage curves; the at least one semi-insulating region being designed so as to optimize the transition voltage of the capacitance-voltage curves produced by the modeling;

optimizing the frequency multiplier structure to increase the efficiency of frequency multiplication by designing the structure for optimum performance at a specific input power level; transition voltage of the capacitance-voltage nonlinearity being based on the nonlinearity capacitance-voltage curve of the device occurring at an optimum voltage for a particular sinusoidal input signal being multiplied Optionally, this alternative method may comprise a substrate having a semi-insulating GaN formed thereon, and wherein the at least one semi-insulating region comprising one or more of GaN, AlGaN, and impurity doped AlGaN forms parts of a pair of Schottky diodes that are anti-serial, with the anodes connected together, for odd-harmonics generation.

Optionally, this alternative method may comprise, in order to minimize the power absorbed in the varactor frequency multiplier structure so that more power is transferred to the load, developing a phase difference between the current and voltage waveforms at the varactor terminals so that one is at maximum when the other is close to zero.

Optionally, this alternative method may comprise maximizing the power when frequency multiplying at the 3rd harmonic, and wherein the maximum power transferred in the third harmonic drops off at a much greater rate for larger output voltage $V_{0-P}$, requiring proper modeling for accurate design, because at the same time the varactor gets hotter as output voltage V0-P increases, and wherein the alternative method comprises tuning the nonlinearity in the capacitance voltage curve so that the nonlinearity occurs at an optimum level to match the power level of the input signal for maximum efficiency of power upconversion.

Optionally, using this alternative method, the frequency multiplier structure may be an efficient high-power millimeter to sub-millimeter wave frequency generator and the at least one semi-insulating region may comprise at least one semi-insulating wide bandgap AlGaN layer which is designed based on choice of composition, doping, and thickness to greatly improve the conversion efficiency, and the at least one GaN layer may be designed based upon doping and thickness to greatly improve the conversion efficiency.

A preferred embodiment of the present invention comprises two in anti-serial connection; each of the two inhomogeneously doped Schottky diodes comprising at least one GaN layer which is designed based upon doping and thickness to greatly improve the conversion efficiency.

Optionally the preferred embodiment comprises two Schottky diodes that are inhomogeneously doped and are in anti-serial connection, each Schottky diode further comprising at least one semi-insulating wide bandgap AlGaN layer which is designed based on choice of composition, doping, and thickness to greatly improve the conversion efficiency.

Optionally the preferred embodiment comprises modeling the varactor using numerical simulations to produce the capacitance-voltage curves when a predetermined sinusoidal input voltage signal at a predetermined frequency in the range of 6 to 60 GHz is applied to the modeled varactor structure, such that by adjusting the impurity doping of the AlGaN and GaN regions, the nonlinear shape of the capacitance-voltage curve that is responsible for frequency multiplication is optimized and so that the transition voltage, measured at the point where the transition from high to low capacitance occurs in the capacitance-voltage curve is optimal for an input RF signal of a certain power level, indicating peak voltage of input signal, whereby the input power is optimized for optimal consideration of the device nonlinearity so that efficient power conversion occurs from the input frequency to the output frequency.

Optionally, the preferred embodiment comprises the at least one semi-insulating wide bandgap AlGaN layer comprises incorporating aluminum in the range of approximately 5% to 45% and wherein the voltage across the varactor varies to an output voltage ranging from approximately 4 to 24 volts and wherein the output efficiency of the varactor is maximized when the current and power are substantially out of phase.

Optionally the preferred embodiment comprises two anti-serial-Schottky diodes which are quasi-monolithically integrated into microstripline circuit, and wherein the varactor is optimized for the highest frequency conversion efficiency at a particular output power level by modifying the Aluminum content in the AlGaN layer.

Optionally the preferred embodiment comprises adjusting the impurity doping and aluminum content of the AlGaN layer by modeling of the varactor on a computer to produce capacitance-voltage curves; such that the aluminum composition of the AlGaN region and impurity doping of the AlGaN and GaN regions can be adjusted so that the voltage, $V_{TR}$ measured where the transition from high to low capacitance occurs in the capacitance-voltage curves is optimal for an input RF signal of a predetermined power level measured at peak voltage of an input signal.

Optionally the preferred embodiment comprises two inhomogeneously doped Schottky diodes each comprise an ohmic contact through which an input voltage is inputted, and a Schottky contact, the Schottky contacts being connected together, and a surface passivation layer positioned between the Schottky contacts and the ohmic contacts; and wherein each Schottky diode comprises a GaN layer approximately 0.25 to 0.3 μm thick having a carrier concentration of approximately $1 \times 10^{18}$ carriers per $cm^3$, and an AlGaN layer approximately 0.02 μm thick having a carrier concentration of approximately $5 \times 10^{16}$ carriers per $cm^3$.

BRIEF DESCRIPTION OF THE DRAWINGS

The embodiments herein will be better understood from the following detailed description with reference to the drawings, in which:

FIG. 1A is a schematic illustration of an equivalent circuit diagram of a preferred embodiment representing the complete ASV structure simulated.

FIG. 1B is a schematic illustration showing the cross sectional structure of one half of the ASV simulated. All dimensions, in micrometers, are merely examples, and are approximate.

FIG. 2 is a schematic illustration showing the Epi-layer composition of regions S1, S2 and S3 of the structure shown in FIG. 1.

FIG. 3A illustrates the concept of basing of the choice of structure on input power. The semi-insulating region is designed so that the overlap of the signal with the capacitance-voltage curve is ideal for maximum conversion efficiency. The curves from left to right are for the AlGaN region having an aluminum composition of 5%, 15%, 25%, 35%, and 45%.

FIG. 3B further illustrates the concept of FIG. 3A showing the signals 1, 2, and 3 versus biasing voltage.

FIG. 3C is an illustration showing the capacitance-voltage characteristics at 60 GHz for structure S1. The curves with capacitance transitions going from left to right in bias correspond to devices with AlGaN region aluminum percentages of 5%, 15%, 25%, 35%, and 45%.

FIG. 3D is an illustration showing the capacitance-voltage characteristics at 60 GHz for structure S2. The curves with capacitance transitions going from left to right in bias correspond to devices with AlGaN region aluminum percentages of 5%, 15%, 25%, 35%, and 45%.

FIG. 4A is an illustration showing the power in the third harmonic relative to total output power indicating optimum choice of structure based on input signal voltage amplitude. The structure considered in FIG. 4A is S1 of FIG. 1, Aluminum composition of the AlGaN layers are 5% (solid line), 15% (dashed line), and 25% (dotted line). Input sinusoidal signal's frequency is 60 GHz, and therefore, the output signal frequency being optimized for is at 180 GHz, example for $3^{rd}$ harmonic generation.

FIG. 6 is an illustration showing current (dashed line) and voltage (solid line) across the ASV consisting of structure S2 with AlGaN layer aluminum composition of 15%, for the 60 GHz input sinusoid with voltage from 0 to peak, $V_{0-P}$, of 16 V.

FIG. 8A illustrates the electron concentration for an ASV containing the layer structure S2 and with 15% Al composition at 15 V applied bias. Two different cases of polarization charge at the $Al_{1.5}Ga_{85}N$/GaN interface are considered: positive for Ga-face polar material (solid curve) and negative for N-face polar material (dashed curve). The gray regions are the Schottky contact. In both FIGS. 8A and 8B, the Schottky contacts are connected together. FIG. 8A illustrate a device to which a 15 V is applied to the ohmic contact of the device FIG. 8B also illustrates the electron concentration for an ASV containing the layer structure S2 and with 15% Al composition at 15 V applied bias. Two different cases of polarization charge at the $Al_{1.5}Ga_{85}N$/GaN interface are considered: positive for Ga-face polar material (solid curve) and negative for N-face polar material (dashed curve). The gray regions are the Schottky contact. In both FIGS. 8A and 8B, the Schottky contacts are connected together. FIG. 8B illustrates a device in which the ohmic contact is grounded. FIG. 1 indicates where the ohmic contact is relative to the Schottky contact for both FIGS. 8A and 8B.

FIG. 9 illustrates results for an ASV based on structure S3 (represented in FIG. 2). Curves with markers indicate the power in the third harmonic relative to total power (in current squared) across the ASV for an input sinusoidal signal at frequency between 5 GHz and 110 GHz with $V_{0-P}$ of 4 V (dashed line), 8 V (solid line) and 16 V (dotted line). Total RF power absorbed in the device per cycle is also indicated.

DETAILED DESCRIPTION OF THE PREFERRED EMBODIMENTS

Figure 4B:
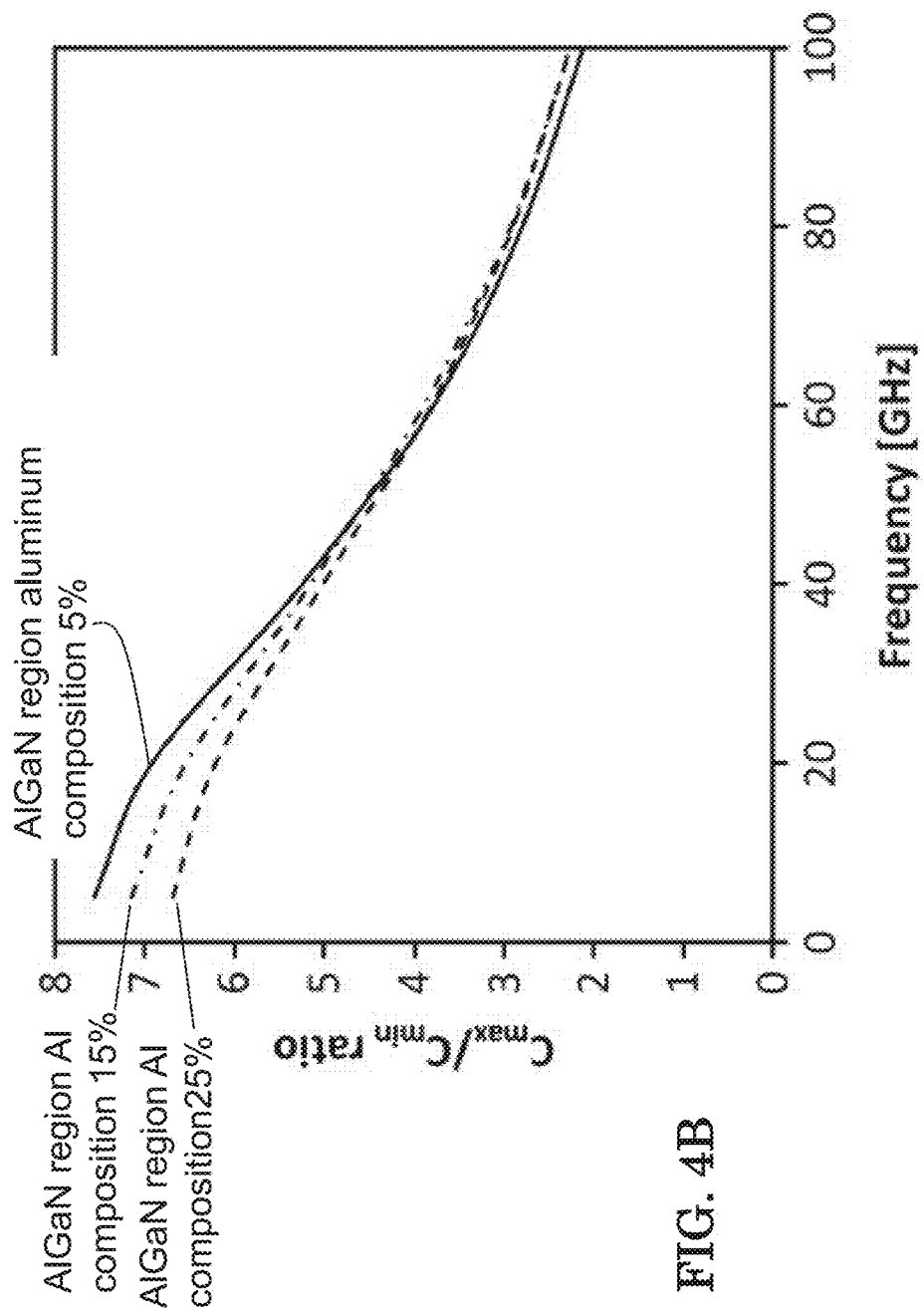
FIG. 4B is an illustration showing the Cmax/Cmin ratio measured across the ohmic contacts for structure S2 at different frequencies. AlGaN region aluminum compositions are 5% (solid line), 15% (dot dash) and 25% (dashed).

The embodiments of the invention and the various features and advantageous details thereof are explained more fully with reference to the non-limiting embodiments that are illustrated in the accompanying drawings and detailed in the following description. It should be noted that the features illustrated in the drawings are not drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention. Rather, these embodiments are provided so that this disclosure will be thorough and complete, and will fully convey the scope of the invention to those skilled in the art. In the drawings, the dimensions of objects and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various ranges, elements, components, regions, layers and/or sections, these elements, components, regions, layers and/or sections should not be limited by these terms. For example, when referring first and second ranges, these terms are only used to distinguish one range from another range. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that are farthest away from a substrate.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

A preferred methodology and embodiment comprises a varactor frequency multiplier structure (approach applicable to higher odd-harmonic multipliers) that can be optimized for highest efficiency frequency conversion at a particular power level. Along with the methodology for optimizing the semi-insulating/GaN structure, the present invention also provides benefits coming from the wide bandgap semiconductor material and high thermal conductive substrates which will allow for high power operation. Current varactor multipliers are based on InAs, GaAs, and InP material systems; both the material and the currently used structures put them at a disadvantage when it conversion efficiency and output power are considered.

The present invention is expected to have wide distribution in high-frequency, and high-power applications from personnel-sized portable and ground based communication systems, radar and EW systems, satellite communications, IED detection and mitigation systems requiring RF sensing and RF countermeasures, biological/chemical hazard detection, and concealed weapons detection.

The article entitled "Critical Design Issues for High-power GaN/AlGaN Anti-serial Schottky Varactor Frequency Triplers", by P. B. Shah and H. A. Hung, Microelectronics Journal, v. 43, p. 410, 2012, is hereby incorporated by reference.

The preferred embodiment of the invention includes AlGaN/GaN Schottky diodes connected anti-serially so that their anodes are connected together as shown in FIG. 1A. FIG. 1B shows one half of the invention or one Schottky diode 12. The two Schottky diodes 11, 12 are connected by the Schottky contacts 17 form the preferred embodiment Anti-serial Schottky Varactor (ASV). The region 15 may comprise S1, or S2, or S3 of FIG. 2. Shown in FIG. 1B is a region 16 having the epi-layer region 15, surface passivation $Si_3N_4$ layer 13, and Ohmic contact 14 formed thereon. Region 16 is preferably an epilayer of GaN grown or deposited on top of a substrate (GaN, or SiC, or AN) and upon which regions 15, 14, and 13 are placed. $N_D$ is an example of the dopant concentration of donor atoms in the GaN layer to make it n-type. The dimensions shown in FIG. 1B are approximate and are shown in micrometers. For example, the region 15 may be approximately 0.3 microns thick, and approximately 7 microns in length.

Drift-diffusion model based numerical simulations have produced the capacitance-voltage curves shown in the top of FIG. 3 for structure S2 when a sinusoidal input voltage signal at 60 GHz is applied to the device. The nonlinear shape of the capacitance-voltage curve is responsible for frequency multiplication. The aluminum composition of the AlGaN region (shown within S1 and S2 in FIG. 2) and the impurity doping of the AlGaN and GaN regions can be adjusted so that the voltage, $V_{TR}$, where the transition from high to low capacitance occurs in the capacitance-voltage curve (i.e. the nonlinearity in the curve) is optimal for an input RF signal of a certain power level (peak voltage of input signal). This shift in $V_{TR}$ doesn't occur in conventional varactor structures because the conventional varactor structures do not include semi-insulating materials. Therefore this optimization based on input power cannot be achieved for conventional varactor structures. FIG. 3B illustrates three different voltage signals "signal 1", "signal 2", and "signal 3." The overlap of the input signal (S1, S2, or S3) with the capacitance-voltage nonlinearity ("structure 2", "structure 3", or "structure 4") is different. This needs to be considered analytically or numerically for optimal consideration of the device nonlinearity so that efficient power conversion occurs from the input frequency to the output frequency. FIG. 4A indicates that for a particular input power level (horizontal axis), the aluminum composition and doping concentration can be properly chosen for optimum frequency conversion considering the methodology indicated in FIG. 3B.

Generally speaking, it is important that the top of the AlGaN region in FIGS. 1B and 2 should be Ga-polar material and not N-polar. The polarity can be controlled by the growth method and substrate used. Both metal-organic chemical vapor deposition and molecular beam epitaxy can be used to deposit the layers for the varactor structure. Design variables are the aluminum composition of the AlGaN layer, and the intentional dopant level of both the AlGaN and GaN layers.

Presently known varactor multiplier structures cannot be as efficient in frequency conversion as an optimized version of the present invention, since they do not provide a method to optimize the structure so that based on the power of the input signal being converted to a higher frequency, the output will contain most of the energy in the desired harmonic. Prior art materials such as AlGaAs/GaAs varactor structures do not provide the means to control the voltage where the transition from high capacitance to low capacitance occurs (the voltage where strong nonlinearity occurs) because the intrinsic carrier concentration of the wide-bandgap material (AlGaAs etc.) has a much higher intrinsic free carrier concentration and mobility compared to AlGaN.

Also, the use of group III-nitride based varactors, because of their higher breakdown voltage and high thermal conductivity with the SiC or AN substrates, can offer much higher output power density than structures fabricated from GaAs or InP.

The present invention comprises a unique technique for optimizing the device structure to manufacture a highly efficient high-power millimeter to sub-millimeter wave frequency generator based on properly designing the semi-insulating wide bandgap AlGaN layer (choice of composition, doping, and thickness), and the GaN layer (doping and thickness) to greatly improve the conversion efficiency for high frequency (harmonic) generation. This invention provides an additional degree of freedom for designing the frequency multiplier so that more power can be transferred from the input fundamental frequency to a higher harmonic frequency at the output compared to the current state of the art.

The GaN based multiplier approach can offer much higher output power at millimeter wave than other approaches based on fundamental frequency amplifiers or sources.

Possible uses of the present invention include specific device structures that can provide high-frequency signals for efficient high-bandwidth soldier portable or ground based communication systems (wireless or satellite). Also, these devices can provide sub-millimeter-wave sources for covert communications, astrophysics and planetary science, sources for single frequency and hyper-spectral detection of chemical or biological agents in the atmosphere. Furthermore, the devices can be used in systems that detect and mitigate or neutralize IEDs and also concealed weapon detection systems. Furthermore this can be used in electronic warfare systems.

The use of a semi-insulating material in conjunction with the preferred embodiments of the present invention provide another degree of freedom in designing the varactor structure for efficient frequency conversion (upconvert to third order or high order odd harmonics) at a particular input signal power level of operation. Also, recognizing and taking advantage of this degree of freedom to tune the nonlinearity in the capacitance voltage curve so that the nonlinearity occurs at an optimum level to match the power level of the input signal for maximum efficiency of power upconversion.

The preferred embodiment semi-insulating/GaN/substrate anti-serial Schottky varactor frequency multiplier structure can be optimized to increase the efficiency of frequency tripling (or higher order multiplication) by designing the structure for optimum performance at a specific input power level. The preferred embodiment exhibits an additional optimization degree of freedom (the transition voltage of the capacitance-voltage nonlinearity) based on its semi-insulating regions compositions (both the aluminum composition and impurity doping in the case of AlGaN). These semi-insulating regions are to be designed so that the nonlinearity (transition) in the capacitance-voltage curve of the device occurs at an optimum voltage for a particular sinusoidal input signal being upconverted through frequency mixing.

The Group III-nitride materials used in conjunction with preferred embodiments of the present invention facilitate high-power high-frequency applications, Group III-nitride materials offer the advantage of high power operation due to their large energy gap (3.4 eV for GaN and higher for AlGaN/GaN alloys) which leads to their high breakdown voltage compared to other III-V compound semiconductor materials. In addition, these III-nitride materials exhibit good electron saturation and peak velocities, large band offsets, and good thermal conductivity. Cutoff frequencies of single diode GaN varactors have been demonstrated at 360 GHz. See for example, C. Jin, et al., "A novel GaN-based high frequency varactor diode," Proceedings of the 5th European Microwave Integrated Circuits Conference, 2010, pp. 118-121, hereby incorporated by reference. GaN based varactors are promising for high Q varactors with high operating power levels. See for example, W. Lu, et al., "InGaN/GaN Schottky diodes with enhanced voltage handling capability for varactor applications," IEEE Electron Device Lett., 31 (2010), pp. 1119-1121, hereby incorporated by reference.

To generate high frequencies, three different structures that can triple the input frequency have been discussed in the literature for the III-nitride material system. These are the metal-semiconductor-metal (MSM) 2D electron gas (2DEG) varactor (as described further in M. Marso, et al., "Comparison of AlGaN/GaN MSM varactor diodes based on HFET and MOSHFET layer structures" IEEE Electron Device Lett., 27 (2006), pp. 945-947 (hereby incorporated by reference)), the anti-serial Schottky varactor (ASV), and the heterobarrier varactor (HBV), as described further in M. Krach, et al. "Power generation at millimeter-wave frequencies using GaAs/GaAlAs triplers," Phys. Status Solidi (c). 1 (2004), pp. 2160-2182, and M. Saglam, et al., "Influence of polarization charges in Al0.4Ga0.6N/GaN barrier varactors," Appl. Phys. Lett., 82 (2003), pp. 227-229, N. Tanuma, et al., "Capacitance analysis of Al0.25Ga0.75N/GaN heterostructure barrier varactor diodes," Phys. Status Solidi (c), 2 (2005), pp. 2692-2695, all of which are hereby incorporated by reference.

The MSM-2DEG and anti-serial Schottky varactor (ASV) structures exhibit lower leakage currents due to the larger barrier a metal/semiconductor or metal/insulator/semiconductor structure presents to free carrier flow compared to the AlGaN/GaN interface. On the other hand, both the anti-serial Schottky varactor (ASV) and HBV structures are typically considered vertical structures, while the MSM-2DEG structure is a lateral structure. For GaN devices in general vertical structures can handle higher power than lateral structures due to the electric field distribution. Besides these issues, symmetric performance is also desired for easier implementation and greater system reliability.

Symmetric varactors are a name given to varactors that offer symmetric capacitance-voltage (CV) characteristics and anti-symmetric current-voltage (I-V) characteristics. As varactors, these have an advantage of not needing both a DC bias or idler circuits at even harmonics when used as a frequency tripler. This is because the C-V and I-V characteristics of the structure results in an absence of second harmonic generation and greater third harmonic conversion efficiency. The III-nitride materials are piezoelectric and this complicates creating symmetric varactors using the HBV design because the polarization fields lead to large sheet charge densities in the device structure that shift the axis of symmetry of the CV characteristics away from zero bias. In this regard, see, O. Ambacher, et al., "Two dimensional electron gases induced by spontaneous and piezoelectric polarization in undoped and doped AlGaN/GaN heterostructures," J. Appl. Phys., 87 (2000), pp. 334-344, hereby incorporated by reference. The piezoelectric nature of the III-nitride materials can also lead to design issues for anti-serial Schottky varactor (ASV) structures and this will be described hereinafter.

The analytical results of the performance capabilities of AlGaN/GaN ASV frequency triplers are demonstrated and some of the design issues discussed hereinafter. Of the many device/material variables possible to investigate, the main focus is on AlGaN material composition, and how this affects output power performance. However, this is merely an example, and the invention is not limited to AlGaN material composition.

Procedure

The Anti-serial Schottky Varactor (ASV) is formed of two identical Schottky diodes with their Schottky contacts connected together as shown in the schematic illustration given in FIG. 1A. Each of the Schottky diodes 11, 12 comprises the layer structure shown in the FIG. 1B (although only one is shown in FIG. 1B. The input signal to be tripled is connected across the two ohmic contacts 14 of the ASV. FIG. 2 shows examples of three different epi-layer compositions that can be used in connection with the region 15 of FIG. 1B. However, the numbers of different epilayers increases as in the AlGaN layer, the Al composition can be varied, for example, from 5% to 45%. The $Si_3N_4$ used for the surface passivation layer 13 may be 250 nm thick. As shown, the ASV is composed of high/low doped regions because a carefully designed non-uniform doping profile is utilized for susceptance modulation, even when self biasing of the device takes place as had previously been detailed. See in this regard M. Krach, et al., "Power generation at millimeter-wave frequencies using GaAs/GaAlAs triplers," Phys. Status Solidi (c), 1 (2004), pp. 2160-2182. Results had been reported previously for an AlGaAs/GaAs ASVs with the narrow energy bandgap region containing a high/low doped layer structure (see for example, M. Krach, et al., An integrated ASV frequency tripler for millimeter-wave applications, in: Proceedings of the 33rd European Microwave Conference, vol. 3, 2003, pp. 1279-1281) (hereby incorporated by reference). Similarly structure S1 contains the narrow energy bandgap GaN region consisting of a high/low doped region. On the other hand, for structure S2 the AlGaN layer can also be grown unintentionally doped with a background concentration $1 \times 10^{18}$ cm$^{-3}$, and so this may be also chosen for the high doped region (as described further in R. Oberhuber, et al., "Mobility of two-dimensional electrons in AlGaN/GaN modulation-doped field-effect transistors, Appl Phys. Lett., 73 (1998), pp. 818-820 (hereby incorporated by reference).

Cylindrical, three-dimensional structures formed by rotating the structure in FIG. 1 about the left axis may be utilized and were simulated using the drift-diffusion finite-element software package Atlas/Blaze developed by Silvaco Inc. Conventional Ga-face polarity material is considered for part of the study except towards the end where the performance issues with N-face polar material in an AlGaN/GaN ASV structure are discussed (see in this regard O. Ambacher, et al., "Two dimensional electrongases induced by spontaneous and piezoelectric polarization in undoped and doped AlGaN/GaN heterostructures," J. Appl. Phys. 87 (2000) 334-344. Polarization charges were included at the AlGaN/GaN and AlGaN/metal contact interfaces (see for example, V. Fiorentini, et al., "Evidence for nonlinear macroscopic polarization in III-V nitride alloy heterostructures," Appl. Phys. Lett. 80 (2002) 1204-1206) (hereby incorporated by reference), along with thermionic emission. A theoretical value of the Richardson constant was used and scaled for different Al percentages (see for example, D. Qiao, et al., "Dependence of Ni/AlGaN Schottky barrier height on Al mole fraction," J. Appl. Phys. 87 (2000) 801-804. The Schottky metal/AlGaN barrier height was set to 1 eV to reasonably consider the large range of barrier heights reported in the literature. An appropriate concentration and field dependent mobility model for GaN and AlGaN was used (see, for example, M. Farahmand, et al., "Monte Carlo simulation of electron transport in the III-Nitride Wurtzite phase materials system: binaries and ternaries," IEEE Trans. Electron Devices 48 (2001) 535-542). Also a saturation drift velocity of $2.5 \times 10^7$ cm/s was used for GaN (see, for example, U. V. Bhapkar & M. S. Shur, "Monte Carlo calculation of velocity-field characteristics of Wurtzite GaN, J. Appl. Phys. 82 (1997) 1649-1655 (hereby incorporated by reference)).

For all the simulations executed, it was assumed that the device is ideally terminated at the input and output ports so that maximum power transfer takes place from the source to the load and unwanted harmonics are rejected. This allowed focus on designing a device for optimum generation of a given harmonic of the fundamental. Similar procedures of analyzing just the efficiency of the structure for frequency multiplication by observing the ratio J3/J1 was done to understand narrower energy bandgap material varactor performance (see for example, in this regard, A. Reklaitis, "Efficient heterostructure doped-barrier varactor diodes," J. Appl. Phys. 105 (2009) 024502-1-024502-5 (hereby incorporated by reference)) and for THz generation in double heterojunction structures (see for example, in this regard, D. S. Ong & H. L. Hartnagel, "Enhanced THz frequency multiplier efficiency by quasi-ballistic electron reflection in double-heterojunction structures, Euro-phys. Lett. 81 (2008) 48004-1-48004-6 (hereby incorporated by reference)).

Initially, AC simulations were done with the device simulation software package Silvaco, Atlas/Blaze, to obtain the capacitance-voltage (C-V) curves of the Anti-serial Schottky Varactor (ASV). Following that, transient simulations of the ASV were performed with an input voltage sine wave followed by taking a Fourier transform of the resulting output current to obtain the frequency spectrum. The ASV's third harmonic conversion capability is determined as the amplitude squared of the third harmonic current through the ASV divided by the amplitude squared of the total current through the ASV. An integral in time of the product of the total current through the ASV and voltage across provided the power absorbed in the device over a cycle.

Results

FIG. 3C illustrates the 60 GHz small signal capacitance across the ASV for structures S1 and FIG. 3D illustrates the 60 GHz small signal capacitance across the ASV for structure S2 as the bias is increased. These curves are important since small signal analysis of varactors can be used to understand their large signal performance as a frequency tripler (on this point, see for example, Y. Morandini, et al., "Characterization of MOS varactor with Large Signal Network Analyser (LSNA) in CMOS 65 nm bulk and SOI technologies, in: Proceedings of the 69$^{th}$ ARFTG Conference, vol. 1, 2007, pp. 1-4) (hereby incorporated by reference). To measure these types of curves, one would need to do a complete calibration and proper lumped element modeling of the device accounting for parasitic, as is typically done using a network analyzer to obtain S parameter models of HEMTs (on this point, see for example, A. Jarndal & G. Kompa, "A new small signal modeling approach applied to GaN devices," IEEE Trans. Microwave Theory Tech. 53 (2005) 3440-3448 (hereby incorporated by reference)). FIGS. 3C, 3D indicate that as the percent of aluminum increases, the knee voltage for the capacitance transition from $C_{max}$ to $C_{min}$ moves to higher applied biases. This is because the wider bandgap AlGaN region has a lower intrinsic free carrier concentration making it more resistive than the GaN region and therefore a larger fraction of the applied bias drops across it rather than the GaN region. With larger Al composition the region becomes even more resistive, moving the knee further to the right of FIGS. 3C, 3D. Eventually the GaN region starts to deplete and that produces most of the capacitance drop observed. FIGS. 3C, 3D also indicates that the capacitance drop off is steeper for the varactor with an AlGaN/low doped GaN (S2) compared to the AlGaN/high/low doped GaN (S1) layer structure. This is also connected with the lower intrinsic free electron concentration in the AlGaN region compared to the GaN region. Considering this concentration difference, charge neutrality requires that more of the applied bias drops across the AlGaN layer for S1 compared to S2, because S1 has a higher doped region next to the AlGaN layer compared to S2. Therefore, with less voltage dropping across the GaN region closest to the AlGaN layer in S1 compared to S2, as the applied bias increases, less charge is depleted from the high doped GaN region of S1 and therefore the drop in capacitance vs. voltage is less for S1 than that for S2 as shown in FIG. 3. The high doped GaN region of S1 is fully depleted, the rate of change of capacitance with voltage is roughly the same for both S1 and S2 as observed for capacitance values below 25 pF, because the charge is being removed from regions of the same (low) dopant concentration.

Furthermore, also observed in FIGS. 3C & 3D is that $C_{max}$ and $C_{min}$ of the curves differ only slightly; this difference being directly related to the charge introduced by the polarization and intrinsic free carrier concentration of the larger energy gap material. Though in these figures only positive voltage values are shown, simulations indicate the curves are symmetric about V=0. The model used here had been verified by reproducing correctly the measured C-V curves of AlGaN/GaN Schottky diodes reported in the literature, as for example, in W. L. Liu, et al. "Capacitance-voltage spectroscopy of trapping states in GaN/AlGaN heterostructure field-effect transistors," J. Nanoelectron. Optoelectron. 1 (2006) 258-263, hereby incorporated by reference.

One of the figures of merit for a varactor is the dynamic cutoff frequency, calculated as $f_C = (1/2\pi R_S) \times (1/C_{min} - 1/C_{max})$ where C is capacitance and $R_S$ is the series resistance. See in this regard, M. Krach, J. Freyer, & M. Claassen, "Power generation at millimeter-wave frequencies using GaAs/GaAlAs triplers," Phys. Status Solidi (c)1 (2004) 2160-2182, and D. Choudhury, et al., "Study of the effect of the Cmax/Cmin Ratio on the Performance of Back-to-Back Barrier-N-N (bbBNN) varactor frequency multipliers," IEEE Microwave Guided Wave Lett. 4 (1994) 101-103. Series resistance results from the aggregate of spreading resistance, contact resistance and the impedance of undepleted regions; all of which are exhibited in the structures considered. Assuming similar series resistance is present in the device structures investigated, the capacitance ratios $C_{max}/C_{min}$ may be compared in FIG. 4B. There $C_{max}/C_{min}$ over an input signal frequency range from 0 to 100 GHz for structure S2 is presented with aluminum percentages of 5%, 15% and 25%. That is, the AlGaN region with aluminum compositions of 5%, 15% and 25% are shown by the solid, dot-dash and dashed lines, respectively. The capacitance ratio is limited at higher frequencies by the total time for charge transfer from the reverse bias state to the zero bias condition of the Schottky diode. These times include the charge carrier recombination times, the dielectric relaxation time, and the mobility of the free carriers. At higher frequencies these time-limited effects affect device performance.

For the $Al_{0.25}Ga_{0.75}N$ region structure simulated in FIG. 4B, plotting free carriers around the GaN/AlGaN junction indicates that at 20 GHz the depletion region width is 0.23 μm and at higher frequencies, the distribution of charges in this region decreases. The slight difference between the curves in FIG. 4B for the different aluminum compositions (seen up to 35 GHz) is due to the added effects of polarization charges modifying the actual charge carrier concentration in the GaN region, and the resistance of the AlGaN layer. At frequencies above 35 GHz, the change in the charge density in the AlGaN region is greater than the change in the GaN region and thus, the AlGaN region's charge modulation also has an influence on the capacitance ratio plotted at higher frequencies. These trends are very similar for structure S1. For these devices, the conduction current was less than 1 nA.

Figure 5A:
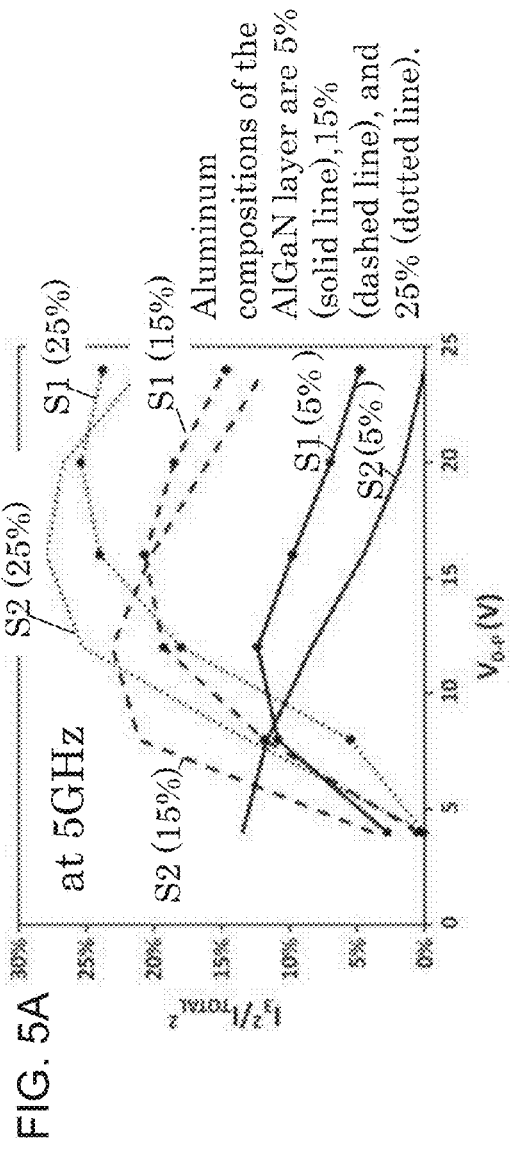
FIG. 5A illustrates power in the third harmonic relative to total power across the ASV for an input sinusoidal signal with zero to peak amplitude between 4 and 24 V at 5 GHz for structures S1 (curves with solid markers), and S2. Aluminum compositions of the AlGaN layer/region are 5% (solid line), 15% (dashed line), and 25% (dotted line).
Figure 5B:
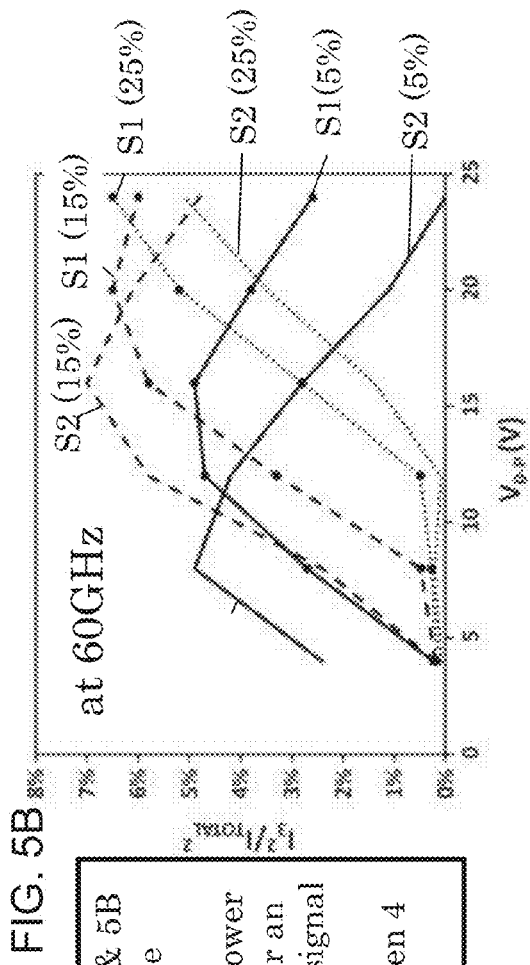
FIG. 5B illustrates, power in the third harmonic relative to total power across the ASV for an input sinusoidal signal with zero to peak amplitude between 4 and 24 V at 60 GHz for structures S1 (curves with solid markers), and S2. Aluminum compositions of the AlGaN layer/region are 5% (solid line), 15% (dashed line), and 25% (dotted line).

FIGS. 5A and 5B illustrate power in the third harmonic relative to total power across the ASV for an input sinusoidal signal with zero to peak amplitude between 4 and 24 V at 5 GHz, (FIG. 5A), and 60 GHz (FIG. 5B), for structures S1 (curves with solid markers), and S2. Aluminum compositions of the AlGaN layer are 5% (solid line), 15% (dashed line), and 25% (dotted line). FIGS. 5A and 5B further indicate the efficiency for frequency multiplication at the 3rd harmonic of structures S1 and S2 for an input signal of 5 GHz (FIG. 5A), and 60 GHz (FIG. 5B). In these figures, the input signal amplitude $V_{0-P}$ increases from 4 to 24 V. For both S1 and S2, 5%, 15%, and 25% Al content in the AlGaN layer are considered. These results indicate that with higher Al percent, the peak, $I_3^2/I_{TOTAL}^2$, shifts to larger input signal amplitudes. This can be understood by comparing these results to FIGS. 3C and 3D. There, the knee voltage for the capacitance transition moves to higher biases as the aluminum composition increases. It was concluded that there is optimum input sinusoidal voltage amplitude whereby the interaction of the input sinusoidal voltage with the capacitance-voltage characteristic takes greatest advantage of the nonlinearity present in the capacitance to generate a strong third harmonic in the resulting current. If the applied voltage signal is of higher or lower amplitude such that the excursion in the input voltage signal does not overlap well with the transition from $C_{max}$ to $C_{min}$ in the capacitance-voltage characteristic, the overall effect of the nonlinear capacitance-voltage characteristic would be less than the maximum possible 3rd harmonic response. Also, it was observed that the peaks for structures S1 and S2 occur at different amplitudes of the input signal, $V_{0-P}$. This is related to the steeper transition from $C_{max}$ to $C_{min}$ seen for structure S2 compared to structure S1 in FIGS. 3C and 3D. Finally, it was observed that the peaks in FIGS. 5A and 5B shift to higher $V_{0-P}$ for larger aluminum compositions, and this is directly related to the fact that the corresponding knee voltage for the capacitance transition in FIGS. 3C and 3D also moves to the right. The results shown in FIGS. 5A and 5B indicate that when tripling the frequency of a larger amplitude signal, one should pay particular attention to the Al composition of the AlGaN layer.

Figure 7A:
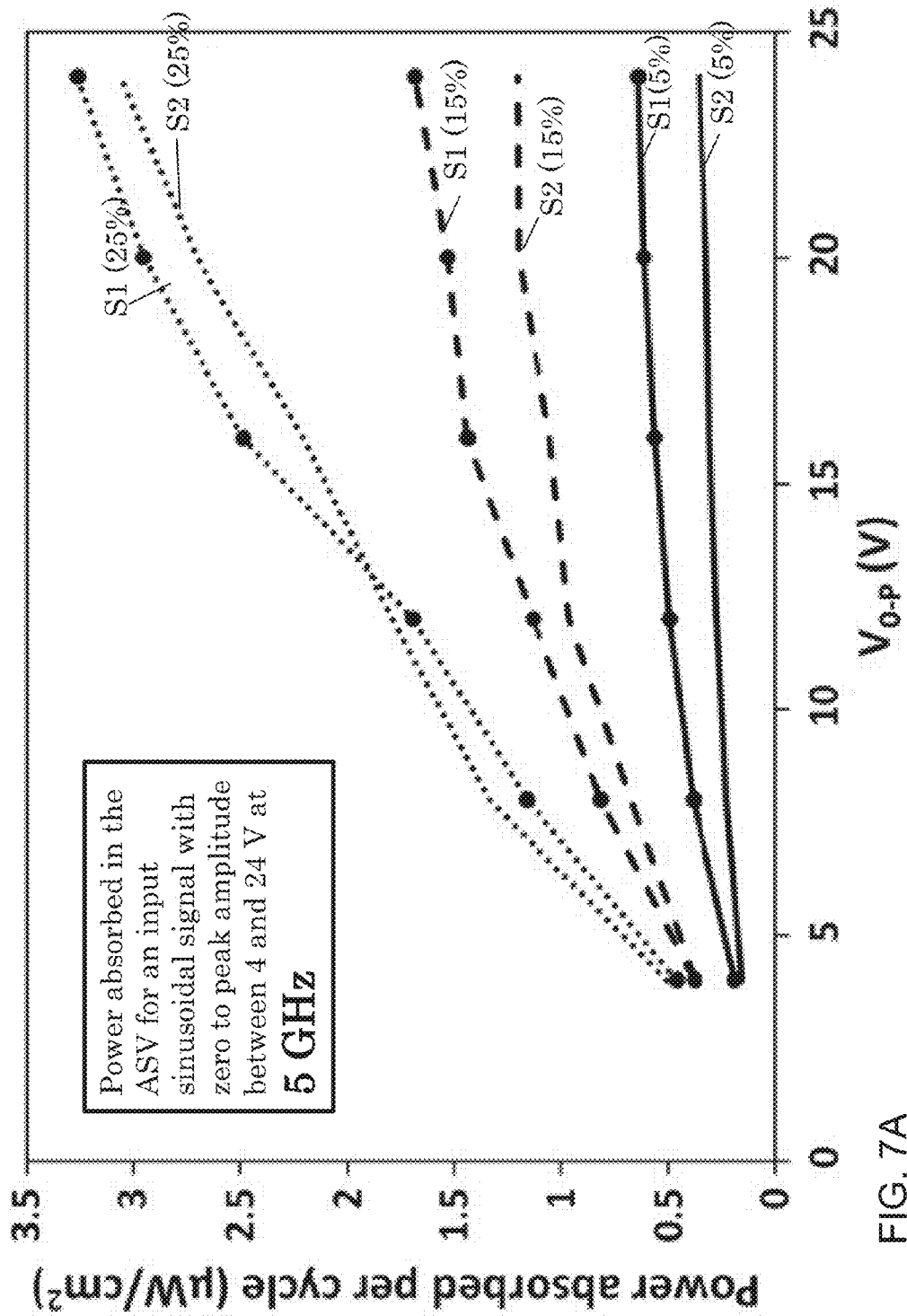
FIG. 7A illustrates the RF power absorbed per cycle for the structure analyzed in FIG. 5A and also shows that the RF power absorbed per cycle saturates (increases at a slower rate) as the signal amplitude increases.
Figure 7B:
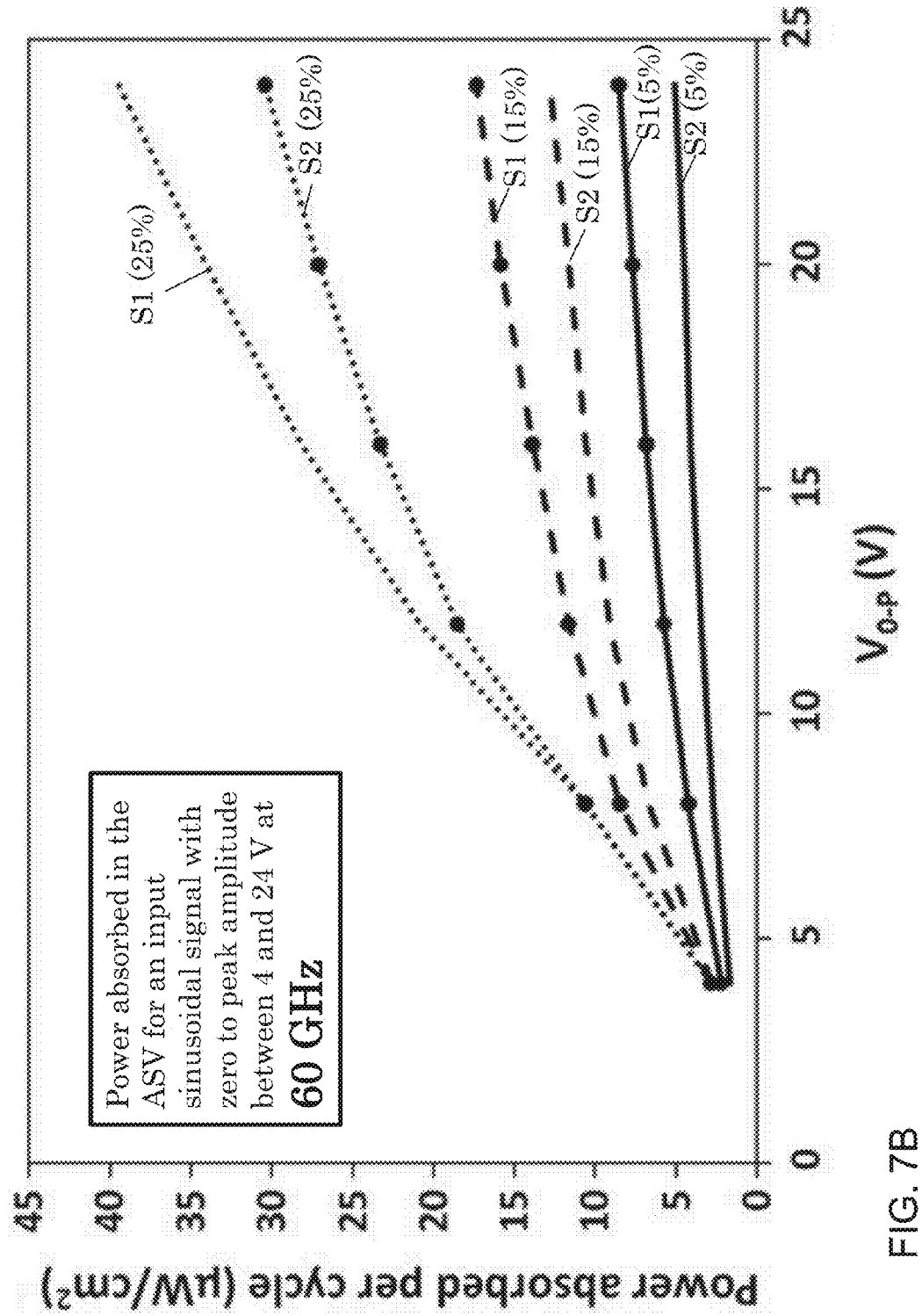
FIG. 7B illustrates the RF power absorbed per cycle for the structure analyzed in FIG. 5B, and also shows that the RF power absorbed per cycle saturates (increases at a slower rate) as the signal amplitude increases.

Besides increasing the cutoff frequency, it is desirable to minimize the power absorbed in the varactor so that more power is transferred to the load. This is brought about by obtaining a phase difference between the current and voltage waveforms at the varactor terminals so that one is at maximum when the other is close to zero. These waveforms are shown in FIG. 6 for structure S2 with 15% Al in the AlGaN layer and a 60 GHz input voltage with $V_{0-P}$=16 V. FIGS. 7A and 7B show the power absorbed per cycle for the same structures analyzed in FIGS. 5A and 5B, respectively. It is interesting to observe here that while the efficiency for frequency multiplication at the 3rd harmonic peaks and then decreases as $V_{0-P}$ increases, the power dissipated in the varactor continues to increase. Thus, the maximum power transferred in the third harmonic drops off at a much greater rate for larger $V_{0-P}$, while at the same time the varactor gets hotter as $V_{0-P}$ increases.

FIGS. 7A and 7B also show that the power absorbed per cycle saturates as the signal amplitude increases. Furthermore, comparing FIGS. 7A and 7B one can see that at higher frequency more power is absorbed per cycle. This can be understood considering each Schottky diode varactor as being modeled by a series combination of a resistor and a capacitor. As the frequency increases, the impedance of the capacitance decreases in this series combination due to greater charge transferred per unit time, and therefore more power is dissipated in the resistive portion of the varactor. This is also expressed with the quality factor, Q, for the varactor when modeled using a series combination of a resistor, $R_S$, and a capacitor, $C_S$. The quality factor, $Q=1/\omega R_S C_S$, decreases at higher frequencies and therefore more power is dissipated in the varactor and bounding the upper frequency limit of operation.

The AlGaN/GaN structures simulated up to this point are made of Ga-face polar material. The term Ga-face polar or the other common equivalent, N-face polar, refers to the arrangement of the atoms in the crystal. This arrangement leads to spontaneous and piezoelectric polarization that causes electric fields in the device which also influence performance. Ga-face polar material is being challenged in high frequency RF MMIC applications by N-face polar AlGaN/GaN structures for HEMTs because of their potentially better properties for high frequency operation. See, in this regard, Rajan, et al., "N-polar GaN/AlGaN/GaN high electron mobility transistors," J. Appl. Phys. 102 (2007) 044501-1-044501-6.

However, N-face polar material is not advantageous for this particular ASV structure where analysis indicates very low conversion efficiencies. The reason for this is the negative charge at the AlGaN/GaN barrier interface when using N-face polar material. This negative charge repels electrons and thus negatively impacts the susceptance modulation as indicated by the electron concentrations shown in FIGS. 8A, the left half, and 8B, the right half of the ASV structure. These figures present the electron concentration through a vertical cut near the Schottky contact at $x=2$ µm from the center of the circular ASV structure S2 that was simulated with an AlGaN layer containing 15% Al. For this result 15 V is applied to the ohmic contact of FIG. 8A while grounding the ohmic contact of FIG. 8B.

Also simulated was a GaN only ASV structure S3. However, it was first observed that the models produced results comparable to data measured for GaN varactors published recently, thus verifying the models we are using. See in this regard, C. Jin, et al. "A novel GaN-based high frequency varactor diode," in: Proceedings of the 5$^{th}$ European Microwave Integrated Circuits Conference, 2010, pp. 118-121 and M. Saglam, et al., Influence of polarization charges in Al0.4Ga0.6N/GaN barrier varactors, Appl. Phys. Lett. 82 (2003) 227-229. AC simulations over the frequency range from 5 GHz to 100 GHz indicate that $C_{max}$ is larger for lower frequencies while $C_{min}$ remains the same. Also, unlike the AlGaN/GaN case, the transition voltage from $C_{max}$ to $C_{min}$ stays the same over this frequency range. The $C_{max}/C_{min}$ ratios at different frequencies were 6.7 at 5 GHz, 5.3 at 30 GHz, 3.3 at 60 GHz, and 1.8 at 100 GHz. The frequency tripling capability of this device is presented in FIG. 9. There we show power in the third harmonic relative to total power in the device vs. input signal frequency for an input amplitude of $V_{0-P}=4$ V (dashed line), 8 V (solid line) and 16 V (dotted line). Also shown are the powers absorbed over one cycle in this device for the same input signal amplitudes indicating saturation of the absorbed power as the frequency increases. One can observe in this figure that at low frequencies the conversion efficiencies for 3rd harmonic generation for the 4 V and 8 V cases are similar and this is due to similar voltage range over which $C_{max}$ occurs unlike the AlGaN/GaN structures. The conversion efficiency for the 16 V input signal is very low, because the interaction between the input sinusoidal voltage signal and the nonlinearity in the capacitance-voltage characteristic is non-optimal, with most of the excursion of the voltage signal being outside of the nonlinearity in the capacitance-voltage characteristic.

Drift diffusion simulation results have been presented for AlGaN/GaN ASV as well as only a GaN ASV. For AlGaN/GaN varactors, it has been demonstrated that the Al composition is a key design variable in optimizing the performance. Also, AlGaN/GaN varactors containing either (1) a high doped/low doped GaN region, or (2) just a low doped GaN region have been compared demonstrating that the choice of which structure to use also depends on the input signal amplitude. The advantages of using Ga-face polar compared to N-face polar AlGaN/GaN material for ASVs has been demonstrated. Finally, results for a GaN ASV performing as a frequency tripler for fundamental frequencies up to 110 GHz indicate an advantage to using an AlGaN/GaN structure over only a GaN structure due to the additional degree of optimization allowed by the AlGaN layer.

As used herein, ASV or anti-serial Schottky varactor means a varactor structure comprising two inhomogeneously doped Schottky diodes in anti-serial connection which may be quasi-monolithically integrated into microstripline circuit (which may be on quartz).

As used herein, the terminology Ga-face polar, or the other common equivalent, N-face polar, refers to the arrangement of the atoms in the crystal.

The terminology Fermi level as used herein relates to doped semiconductors, p-type and n-type, where the Fermi level is shifted by the dopant, illustrated by their band gaps. The Fermi function f(E) gives the probability that a given available electron energy state will be occupied at a given temperature. The Fermi function is defined as:

$$f(E) = \frac{1}{e^{(E-E_F)/kT} + 1}$$

Where E is the band gap of the material, $E_F$ is the Fermi energy in the band gap, k is Boltzmann's constant=$8.6 \times 10^{-5}$ eV/K, and T is the temperature in Kelvin. The Fermi function dictates that at ordinary temperatures, most of the levels up to the Fermi level $E_F$ are filled, and relatively few electrons have energies above the Fermi level.

As used herein, the term "light" means electromagnetic radiation, unless specifically pointed out to the contrary. That is, the photodetectors illustrated in the figures herein may be used in conjunction with other forms of electromagnetic radiation and the terminology "light" encompasses other forms of electromagnetic radiation.

As used herein the terminology "processor" includes computer, controller, CPU, microprocessor; multiprocessor, minicomputer, main frame, personal computer, PC, signal processor, super computer, coprocessor, and combinations thereof or any machine similar to a computer or processor which is capable of processing algorithms.

The terminology "layer" as used in the following claims is not intended to be limiting; including as to size or dimension. The terminology "layer" means a quantity or thickness of material, which may or may not be of uniform thickness or have uniform dimensions. The terminology "layer" as used in the claims includes regions or portions of a composite device or structure.

As used herein the terminology "energy gap" or "band gap" means an energy range in a semiconductor where no electron states exist and which may be represented graphically as the energy difference (in electron volts) between the top of the valence band and the bottom of the conduction band in thesemiconductor material.

As used herein the terminology "mobility" means the mobility of charge carriers in a semiconductor material. The charge carriers may be either electrons or holes.

Electron mobility refers to how quickly an electron can move through a metal or semiconductor, when pulled by an electric field. In semiconductors, there is an analogous quantity for holes, called hole mobility. When an electric field E is applied across a semiconductor material, the electrons respond by moving with an average velocity called the drift velocity.

As used herein the terminology "susceptance" means is the imaginary part of a complex number value of admittance. Admittance is a measure of how easily a circuit will allow current to flow.

As used herein the Ga face polar GaN refers to GaN in a wurtzite crystal structure wherein the four tetrahedrally oriented bonds of Ga are oriented in a way such that one bond points up and is not bonded to a nitrogen atom but instead forming the exposed face of the crystal and the other three bonds are downward and bonded to nitrogen atoms.

As used herein the N face polar GaN refers to GaN in a wurtzite crystal structure wherein the four tetrahedrally oriented bonds of nitrogen (N) are oriented in a way such that one bond points up and is not bonded to a Ga atom but instead forming the exposed face of the crystal and the other threebonds are downward and bonded to Ga atoms.

The foregoing description of the specific embodiments reveal the general nature of the embodiments herein and the present invention is not limited to the embodiments disclosed. Applying current knowledge, modifications and/or adaptations of such specific embodiments are contemplated to be within the scope of the present invention, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

The invention claimed is:

1. A method of optimizing a Ga-nitride device material structure for a frequency multiplication device comprising the following steps not necessarily in sequential order:
    determining the amplitude and frequency of the input signal being multiplied in frequency;
    providing a substrate;
    providing a Ga-nitride region on a the substrate;
    determining a percentage composition of Al in an AlGaN region to be positioned on the Ga-nitride region by selecting an aluminum composition percentage and doping based upon the desired frequency range for the frequency multiplication device in order to optimize power input/output efficiency; and
    selecting an orientation of N-face polar GaN or Ga-face polar GaN material relative to the AlGaN/GaN interface so as to orient the face of the GaN so as to optimize charge at the AlGaN/GaN interface.

2. The method of claim 1 wherein the substrate is one of SiC, GaN, or AN and wherein the Ga-face polar material selected as the N-face polar material creates a negative charge at the AlGaN/GaN barrier that repels electrons and negatively impacts the susceptance modulation as indicated by electron concentrations.

3. The method of claim 1 further comprising
    modeling the Ga-nitride material on a computer using drift-diffusion modeling based upon numerical simulations to produce the capacitance-voltage curves when a predetermined sinusoidal input voltage signal at a predetermined frequency in the range of 6 to 240 GHz is applied to the structure, and
    adjusting impurity doping and aluminum composition of AlGaN and GaN regions to optimize the nonlinear shape of the capacitance-voltage curve that is responsible for frequency multiplication so that the transition voltage, measured at the point where the transition from high to low capacitance occurs in the capacitance-voltage curve, is optimal for an input RF signal of a certain power level, indicating peak voltage of input signal, whereby the structure is optimized for the input power to be upconverted to a higher frequency.

4. The method of claim 3 wherein the adjusting the impurity doping and aluminum composition of the AlGaN region and GaN regions is optimized by modeling a predetermined sinusoidal input voltage on a computer to determine that the maximum of predetermined sinusoidal input voltage is within the capacitance-voltage curve of the structure.

5. The method of claim 1 wherein the power input/output efficiency is optimized dependent upon input voltage and wherein for input voltages over 10 volts an AlGaN/GaN structure with approximately 15% Aluminum provides greater conversion efficiency than an AlGaN/GaN structure with approximately 5% Aluminum.

6. The method of claim 1 wherein by varying the Aluminum from 5% to 15% increases the amount of power absorbed in the varactor and increases its reliability and power transfer.

7. The method of claim 1 wherein the frequency multiplication device is a varactor having an input signal, and further including modeling based upon numerical simulations to produce the capacitance-voltage curves, and wherein the aluminum composition of the AlGaN region and impurity doping of the AlGaN and GaN regions can be adjusted so that the transition voltage measured where the transition from high to low capacitance occurs in the capacitance-voltage curves, which is a point of nonlinearity in the curves, is optimal for an input RF signal of a predetermined power level measured at peak voltage of an input signal.

8. The method of claim 7 further comprising controlling the transition voltage where the transition from high capacitance to low capacitance is optimized by utilizing the intrinsic carrier concentration of the wide-bandgap material AlGaN which has a much higher intrinsic free carrier concentration as compared to AlGaAs.

9. The method of claim 1 wherein the top of the AlGaN region is Ga-polar material which leads to optimal spontaneous and piezoelectric polarization that produces optimal electric fields for optimal performance.

* * * * *